(12) United States Patent
Sakai et al.

(10) Patent No.: US 7,579,917 B2
(45) Date of Patent: Aug. 25, 2009

(54) OUTPUT CIRCUIT FOR OSCILLATOR

(75) Inventors: Motoki Sakai, Kanagawa (JP); Hisato Takeuchi, Kanagawa (JP); Keigo Shingu, Tokyo (JP); Kei Nagatomo, Kanagawa (JP)

(73) Assignee: Panasonic Corporation, Osaka (JP)

( * ) Notice: Subject to any disclaimer, the term of this patent is extended or adjusted under 35 U.S.C. 154(b) by 138 days.

(21) Appl. No.: 11/727,096

(22) Filed: Mar. 23, 2007

(65) Prior Publication Data

US 2007/0236302 A1    Oct. 11, 2007

(30) Foreign Application Priority Data

Mar. 23, 2006    (JP)    ............... 2006-080575

(51) Int. Cl.
  *H03B 5/36*    (2006.01)
  *H03L 5/00*    (2006.01)
(52) U.S. Cl. .................. 331/74; 331/158; 331/182
(58) Field of Classification Search .................. 331/74, 331/158, 182
  See application file for complete search history.

(56) References Cited

U.S. PATENT DOCUMENTS 6,927,641 B2 *    8/2005    Terasawa et al. ............ 331/158

FOREIGN PATENT DOCUMENTS

JP    9-294066    11/1997
JP    11-17452    1/1999

* cited by examiner

*Primary Examiner*—Robert Pascal
*Assistant Examiner*—James E Goodley
(74) *Attorney, Agent, or Firm*—McDermott Will & Emery LLP

(57) ABSTRACT

The object of the present invention is to provide a crystal oscillator with one IC capable of effectively responding to specifications or a frequency of an installed set, an output terminal of the oscillator 1 is connected to an input terminal of the inverter 2, an output terminal of which is connected to the first resistor 7 and one terminal of the second resistor 8, the other terminal of the first resistor 7 is connected to one terminal of the first capacitor 9 and an input terminal of the first transistor 3, the other terminal of the first capacitor 9 is connected to one terminal of the first switch 11, and the other terminal of the first switch 11 is grounded, the other terminal of the second resistor 8 is connected to one terminal of the second capacitor 10 and an input terminal of the second transistor 4, the other terminal of the second capacitor 10 is connected to one terminal of the second switch 12, and the other terminal of the second switch 12 is grounded, an output terminal of the first transistor 3 and an output terminal of the second transistor 4 are connected to the oscillation output terminal 5, and the first switch 11 and the second switch 12 are controlled by the storage device 13.

3 Claims, 3 Drawing Sheets

Cp : BYPASS CONDENSER
CL : LOAD CAPACITOR
RL : LOAD RESISTOR

OUTPUT CIRCUIT FOR OSCILLATOR

BACKGROUND OF THE INVENTION

1. Field of the Invention

The present invention relates to a crystal oscillator having a function of outputting a stable oscillating waveform for various specifications.

2. Description of the Related Art

There are communication methods for cellular phones including PDC (Personal Digital Cellular) which is used in Japan, GSM (Global System for Mobile Communication), and CDMA (Code Division Multiple Access), and there are various specifications for types of cellular phones using the same communication method. For crystal oscillators for temperature control which are mainly used for cellular phones, oscillation output characteristics capable of responding to specifications of all the sets are required.

Hereinafter, a general crystal oscillator TCXO for temperature control will be described. FIGS. 6 and 7 are circuit diagrams showing configurations of the general crystal oscillator TCXO.

Referring to FIG. 6, an output terminal of an oscillator 1 having a quartz vibrator is connected to an input terminal of an inverter 2, an output terminal of which is connected to an input terminal of a first transistor 3 and an input terminal of a second transistor 4. In addition, an output terminal of the first transistor 3 and an output terminal of the second transistor 4 are connected to an oscillation output terminal 5, and an external load element 6 is connected to the oscillation output terminal 5.

Referring to FIG. 7, an output terminal of an oscillator 1 having a quartz vibrator is connected to an input terminal of an inverter 2, an output terminal of which is connected to one terminal of a first resistor 7 and one terminal of a second resistor 8. In addition, the other terminal of the first resistor 7 is connected to one terminal of a first capacitor 9 and the input terminal of the first transistor 3, and the other terminal of the first capacitor 9 is grounded. In addition, the other terminal of the second resistor 8 is connected to one terminal of a second capacitor 10 and the input terminal of the second transistor 4, and the other terminal of the second capacitor 10 is grounded.

In addition, the output terminal of the first transistor 3 and the output terminal of the second transistor 4 are connected to an oscillation output terminal 5, and an external load element 6 is connected to the oscillation output terminal 5.

Hereinafter, the operation of the crystal oscillator TCXO configured as described above will be described.

In the crystal oscillator TCXO shown in FIG. 6, a stable oscillation frequency is generated from the oscillator 1 having the quartz vibrator, and frequency signals at a part A2 of the input terminal of the second transistor 4 and a part A1, in which a signal is phase-inverted by the inverter 2, are phase-inverted from each other. By alternatingly operating the first transistor 3 and the second transistor 4, a stable oscillation signal having a constant amplitude is output to the oscillation output terminal (A3) 5.

Since specifications including a load of an output part and harmonic characteristics are different depending on a set such as a cellular phone to which a crystal oscillator is installed, the optimization of an output waveform is acquired in the crystal oscillator TCXO shown in FIG. 7 by inserting passive elements such as the resistors 7 and 8 or the capacitors 9 and 10 to the part A1, in which a signal is phase-inverted by the inverter 2, the part A2 of the input terminal of the second transistor 4, and the like to delay the rise or fall of the output signal.

As the external load element 6 which is connected to an external circuit, a circuit represented by a bypass condenser Cp, a load capacitor CL, a load resistor RL, and the like which are shown in FIG. 8 as an equivalent circuit is used.

Patent Document 1: JP11-17452
Patent Document 2: JP9-294066

In a general configuration, it is possible to optimize an output waveform by arranging passive elements such as resistors 7 and 8 or capacitors 9 and 10 to the part A1, the part A2, and other parts as described above or the like according to the specifications of a set to which the crystal oscillator is installed, but the characteristics become far off the optimized characteristics for a set having different specifications.

However, to develop one IC (Integrated Circuit) for each of the specifications is inefficient and causes the managing operation complicated, and in a case where one IC is designed to satisfy a plurality of different specifications, the IC cannot show proper characteristics due to its in-between characteristics.

SUMMARY OF THE INVENTION

In order to solve the above-described problems, the object of the present invention is to provide a crystal oscillator capable of efficiently responding to the specifications and frequency of a set in which the crystal oscillator is installed using one IC.

According to an aspect of the present invention, there is provided a crystal oscillator formed by connecting an output terminal of an oscillator having a quartz vibrator to an oscillation output terminal through a buffer circuit, wherein a switch is connected to a part of the buffer circuit which changes oscillation characteristics, the crystal oscillator comprising a shift control unit for controlling the turning on/off of the switch.

In the aspect of the invention, it is preferable that an output terminal of the oscillator having the quartz vibrator is connected to an input terminal of an inverter connected to a first resistor and one terminal of a second resistor, that the other terminal of the first resistor is connected to one terminal of a first capacitor and an input terminal of a first transistor, that the other terminal of the first capacitor is connected to one terminal of a first switch, that the other terminal of the first switch is grounded, that the other terminal of the second resistor is connected to one terminal of a second capacitor and an input terminal of a second transistor, that the other terminal of the second capacitor is connected to one terminal of a second switch, that the other terminal of the second switch is grounded, that an output terminal of the first transistor and an output terminal of the second transistor are connected to the oscillation output terminal, and that the first switch and the second switch are controlled by the shift control unit.

In the aspect of the invention, it is preferable that an output terminal of the oscillator having the quartz vibrator is connected to an input terminal of the inverter, an output terminal of which is connected to an input terminal of a first transistor, an input terminal of a second transistor, and an input terminal of a third transistor, that an output terminal of the third transistor is connected to one terminal of the switch, that the other terminal of the switch, an output terminal of the first transistor, and an output terminal of the second transistor are connected to an oscillation output terminal, and that the switch is controlled by the shift control unit.

In the aspect of the invention, it is preferable that an output terminal of the oscillator having the quartz vibrator is connected to an input terminal of an inverter, an output terminal of which is connected to a first resistor and one terminal of a second resistor, that the other terminal of the first resistor is connected to one terminal of a first capacitor and an input terminal of a first transistor, that the other terminal of the first capacitor is connected to one terminal of a first switch, that the other terminal of the switch is grounded, that the other terminal of the second resistor is connected to one terminal of a second capacitor, an input terminal of a second transistor, and an input terminal of a third transistor, that the other terminal of the second capacitor is connected to one terminal of a second switch, that the other terminal of the second switch is grounded, that an output terminal of a third transistor is connected to one terminal of the third switch, that the other terminal of the third switch, an output terminal of the first transistor, and an output terminal of the second transistor are connected to the oscillation output terminal, and that the first switch, the second switch, and the third switch are controlled by the shift control unit.

In the aspect of the invention, it is preferable that the shift control unit includes a writable and readable storage device.

According to an embodiment of the present invention, all the characteristics such as duty characteristics cycle, amplitude characteristics, load variance characteristics, and harmonic characteristics can be adjusted to the specifications of each set by arranging a shift switch in a passive element such as a resistor, a capacitor, or the like which is disposed in a proper position of a buffer circuit connected to an oscillator, and accordingly, it becomes possible to efficiently respond to the specifications or frequencies of all the sets with a configuration which can be implemented by using one IC.

A crystal oscillator according to an embodiment of the present invention can adjust all the characteristics such as duty characteristics, amplitude characteristics, load variance characteristics, and harmonic characteristics to the specifications of each set by controlling any shift of switches disposed in a proper position of a buffer circuit connected to the crystal oscillator, differently from a general crystal oscillator which is optimized only for the specifications of a set to which a specific type of a crystal oscillator is installed, and has a configuration which can be implemented by using one IC, thereby capable of efficiently responding to the specifications or frequencies of all the sets.

DESCRIPTION OF THE PREFERRED EMBODIMENTS

Hereinafter, embodiments of the present invention will be described with reference to accompanying drawings.

Embodiment 1

Figure 1:
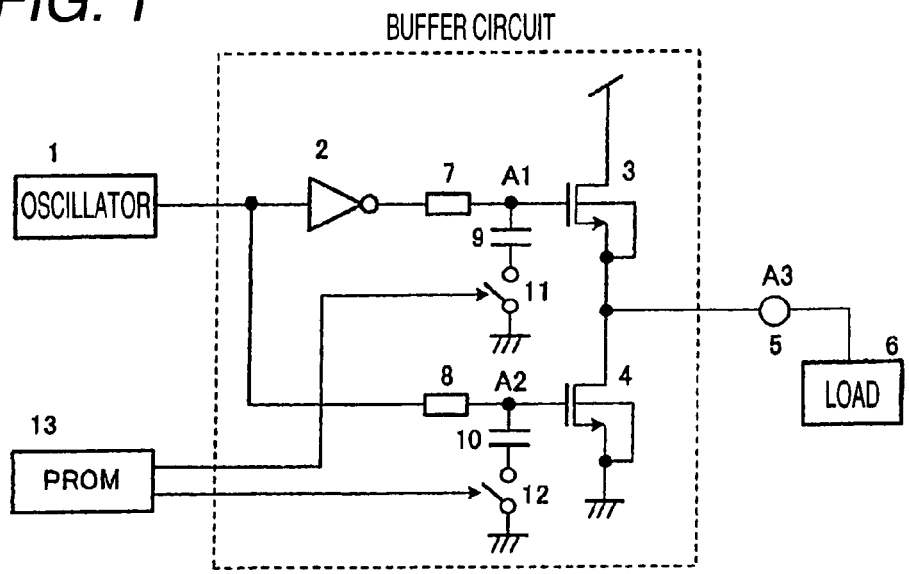
FIG. 1 is a diagram showing a crystal oscillator according to an embodiment 1 of the present invention.

FIG. 1 is a diagram showing a configuration of a crystal oscillator according to an embodiment 1 of the present invention.

In FIG. 1, a reference numeral 1 denotes an oscillator having a quartz vibrator, a reference numeral 2 denotes an inverter, reference numerals 3 and 4 denote transistors, a reference numeral 5 denotes an oscillation output unit, a reference numeral 6 denotes an external load element, reference numerals 7 and 8 denote resistors, reference numerals 9 and 10 denote capacitors, reference numerals 11 and 12 denote switches, and a reference numeral 13 denotes a storage device such as a writable and readable PROM (Programmable Read Only Memory) as a shift controlling unit which turns on/off the switches 11 and 12.

In Embodiment 1, a buffer circuit includes the inverter 2, the transistors 3 and 4, the resistors 7 and 8, the capacitors 9 and 10, and the switches 11 and 12. In Embodiment 1, an output terminal of the oscillator 1 is connected to an input terminal of the inverter 2 of which output terminal is connected to the first resistor 7 and one terminal of the second resistor 8, the other terminal of the first resistor 7 is connected to one terminal of the first capacitor 9 and an input terminal of the first transistor 3, the other terminal of the first capacitor 9 is connected to one terminal of the first switch 11, and the other terminal of the first switch 11 is grounded. In addition, the other terminal of the second resistor 8 is connected to one terminal of the second capacitor 10 and an input terminal of the second transistor 4, the other terminal of the second capacitor 10 is connected to one terminal of the second switch 12, and the other terminal of the second switch 12 is grounded. In addition, an output terminal of the first transistor 3 and an output terminal of the second transistor 4 are connected to the oscillation output terminal 5 which is connected to the external load element 6, and the first switch 11 and the second switch 12 are controlled by the storage device 13.

Hereinafter, the operation of the crystal oscillator according to Embodiment 1 which has an above-described configuration will be described.

A stable oscillation frequency is generated from the oscillator 1, frequency signals at a part A1 in which a signal is phase-inverted by the inverter 2 and a part A2 of the input terminal of the second transistor 4 are phase-inverted from each other. By alternatingly operating the first transistor 3 and the second transistor 4, a stable oscillation signal having a constant amplitude is output to the oscillation output terminal (part A3) 5.

Since specifications including a load of an output part and harmonic characteristics are different depending on a set such as a cellular phone to which the crystal oscillator according to the embodiment is installed, the optimization of an output waveform is acquired in Embodiment 1 by inserting passive elements such as resistors 7 and 8, capacitors 9 and 10, and the like to the part A1, the part A2 and the like to delay the rise or fall of the output signal.

In addition, switches 11 and 12 are arranged at the other terminals of the capacitors 9 and 10, respectively, and the switches are properly turned on/off based on the oscillation characteristics required by the storage device 13 to adjust the delay time of the oscillation waveform.

Figure 2:
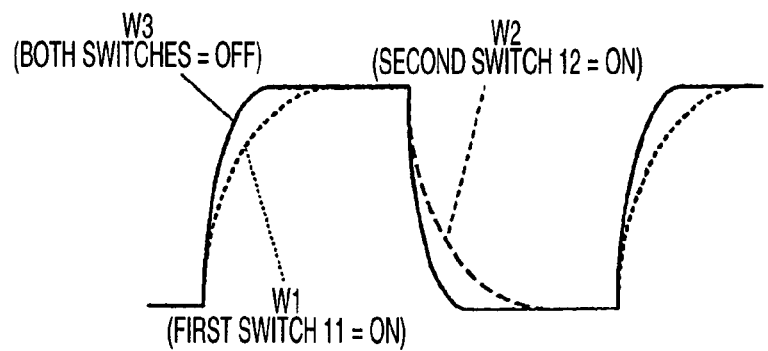
FIG. 2 is an explanatory diagram of an example of an output waveform at an oscillation output terminal in a case where switches are shifted according to Embodiment 1.

FIG. 2 is an explanatory diagram of an example of an output waveform at the oscillation output terminal 5 in a case where the switches 11 and 12 are shifted in Embodiment 1. In FIG. 2, a reference numeral W1 represents an output waveform in a case where the first switch 11 is turned on, a reference numeral W2 represents an output waveform in a case where the second switch 12 is turned on, and a reference numeral W3 represents an output waveform in a case where both the switches 11 and 12 are turned off.

As described above, a crystal oscillator according to Embodiment 1 can adjust all the characteristics such as duty characteristics, amplitude characteristics, load variance characteristics, and harmonic characteristics to the specifications of each set by performing any shift of switches 11 and 12 disposed in each position of an output buffer circuit, differently from a general crystal oscillator which is optimized only for the specifications of a specific set in which a crystal oscillator is installed, and can efficiently respond to the specifications or frequencies of all the sets by using one IC.

Embodiment 2

Figure 3:
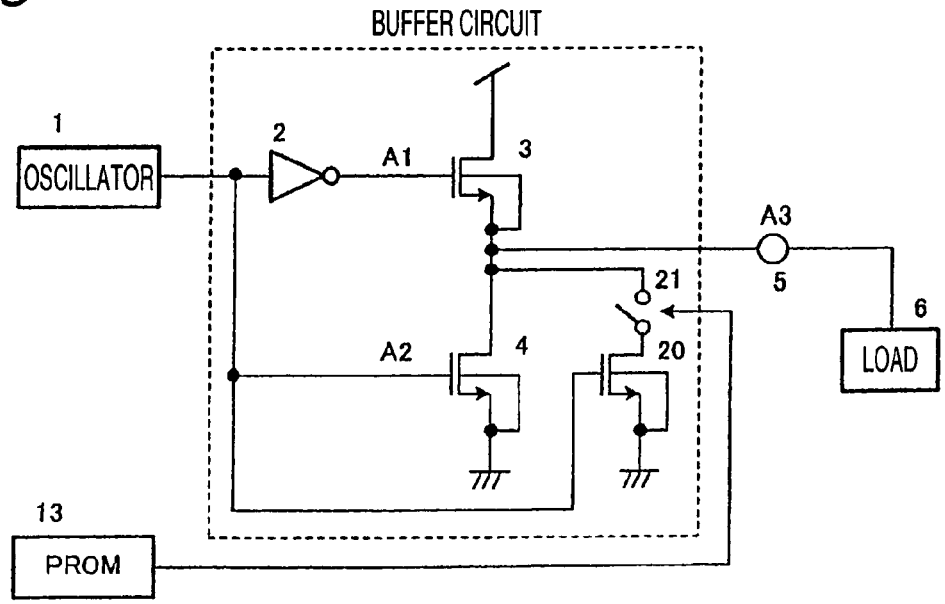
FIG. 3 is a diagram showing a configuration of a crystal oscillator according to an embodiment 2 of the present invention.

FIG. 3 is a diagram showing a configuration of a crystal oscillator according to an embodiment 2 of the present invention. Hereinafter, the same numeral as an above-described member is attached to a member which corresponds to the above-described member, and detailed description thereof will be omitted.

In Embodiment 2, a buffer circuit includes an inverter 2, transistors 3, 4, and 20, and a switch 21. In Embodiment 2, an output terminal of an oscillator 1 is connected to an input terminal of the inverter 2 of which output terminal is connected to an input terminal of the first transistor 3, an input terminal of the second transistor 4, and an input terminal of the third transistor 20, an output terminal of the third transistor 20 is connected to one terminal of the switch 21, the other terminal of the switch 21, an output terminal of the first transistor 3, and an output terminal of the second transistor 4 are connected to an oscillation output terminal 5, and the switch 21 is controlled by a storage device 22 such as a writable and readable PROM as a shift control unit.

Hereinafter, the operation of the crystal oscillator according to Embodiment 2 which has an above-described configuration will be described.

As in Embodiment 1, a stable oscillation frequency is generated from the oscillator 1, frequency signals at a part A1 in which a signal is phase-inverted by the inverter 2 and a part A2 of the input terminal of the second transistor 4 are phase-inverted from each other. By alternatingly operating the first transistor 3 and the second transistor 4, a stable oscillation signal having a constant amplitude is output to the oscillation output terminal (part A3) 5.

As described above, since specifications including a load of an output part and harmonic characteristics are different depending on a set such as a cellular phone to which the crystal oscillator according to the embodiment is installed, the driving capability of an output part is configured to be able to be shifted by connecting the third transistor 20 and the switch 21 to the second transistor 4 in parallel and turning on/off the switch by the storage unit 22 in Embodiment 2.

Figure 4:
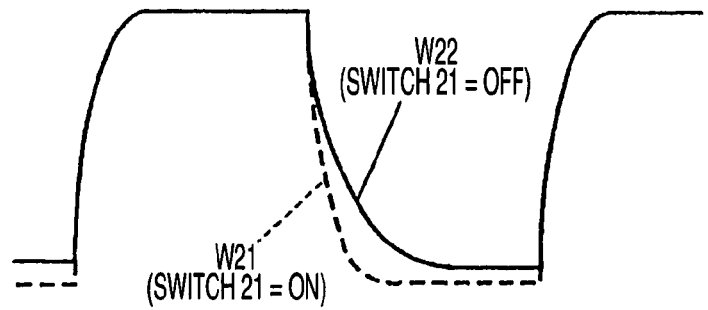
FIG. 4 is an explanatory diagram of an example of an output waveform at the oscillation output terminal in a case where a switch is shifted according to Embodiment 2.

FIG. 4 is an explanatory diagram of an example of an output waveform at the oscillation output terminal 5 in a case where the switch 21 is shifted in Embodiment 2. In FIG. 4, a reference numeral W21 represents an output waveform in a case where the switch 21 is turned on, and a reference numeral W22 represents an output waveform in a case where the switch 21 is turned off.

As described above, a crystal oscillator according to Embodiment 2 can adjust all the characteristics such as duty characteristics, amplitude characteristics, load variance characteristics, and harmonic characteristics to the specifications of each set by performing any shift of the switch 21 disposed in the output part, differently from a general crystal oscillator which is optimized only for the specifications of a specific set and can efficiently respond to the specifications or frequencies of all the sets by using one IC.

Embodiment 3

Figure 5:
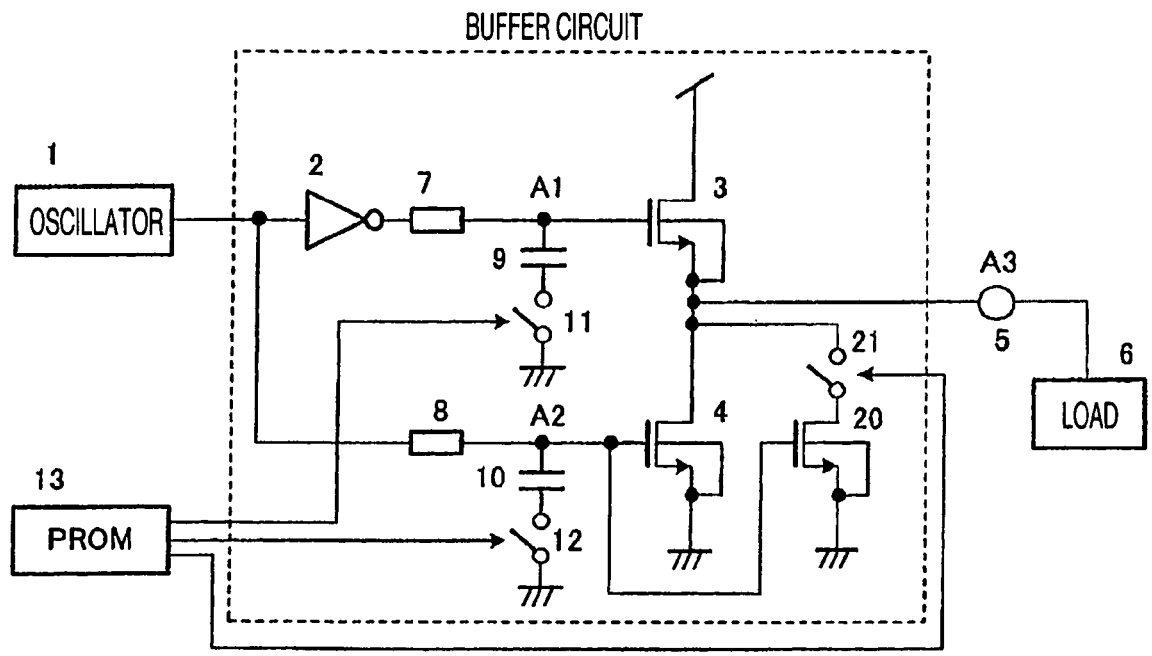
FIG. 5 is a diagram showing a configuration of a crystal oscillator according to an embodiment 3 of the present invention.
Figure 6:
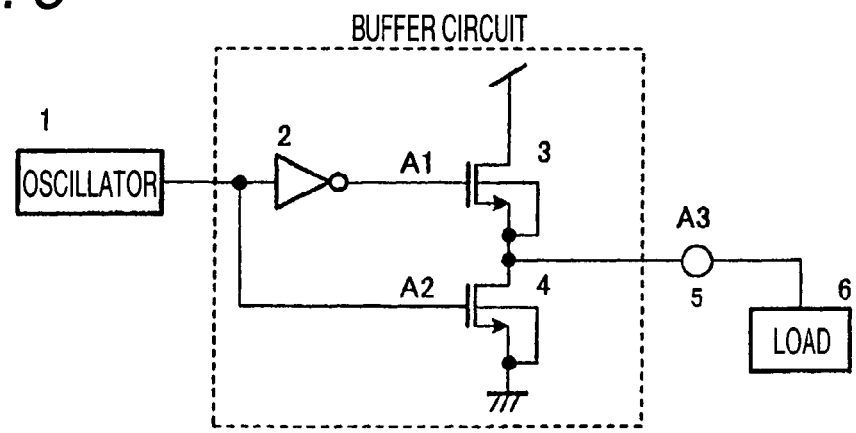
FIG. 6 is a diagram showing a configuration of a known crystal oscillator TCXO.
Figure 7:
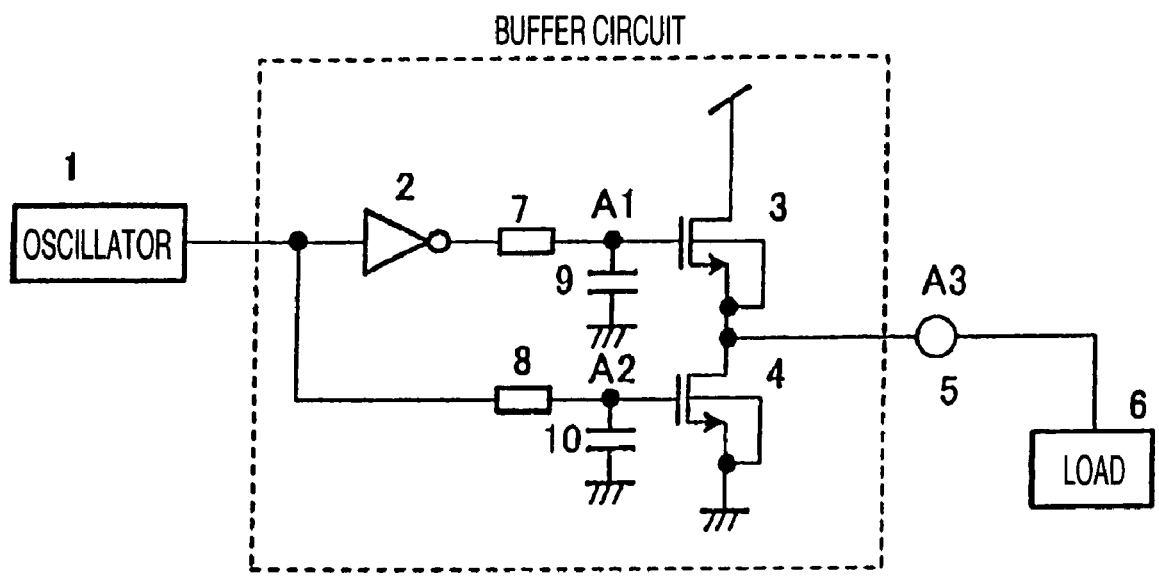
FIG. 7 is a diagram showing a configuration of another known crystal oscillator TCXO.

FIG. 5 is a diagram showing a configuration of a crystal oscillator according to an embodiment 3 of the present invention.

In Embodiment 3, a buffer circuit includes an inverter 2, transistors 3, 4, and 20, resistors 7 and 8, capacitors 9 and 10, and switches 11, 12, and 21. In Embodiment 3, an output terminal of an oscillator 1 is connected to an input terminal of the inverter 2, an output terminal of which is connected to the first resistor 7 and one terminal of the second resistor 8, the other terminal of the first resistor 7 is connected to one terminal of the first capacitor 9 and an input terminal of the first transistor 3, the other terminal of the first capacitor 9 is connected to one terminal of the first switch 11, and the other terminal of the switch 11 is grounded. In addition, the other terminal of the second resistor 8 is connected to one terminal of the second capacitor 10, an input terminal of the second transistor 4, and an input terminal of a third transistor 20, the other terminal of the second capacitor 10 is connected to one terminal of the second switch 12, and the other terminal of the second switch 12 is grounded. In addition, an output terminal of the third transistor 20 is connected to one terminal of the third switch 21, the other terminal of the third switch 21, an output terminal of the first transistor 3, and an output terminal of the second transistor 4 are connected to an oscillation output terminal 5, and the first switch 11, the second switch 12, and the third switch 21 are controlled by a storage device 25 such as a writable and readable PROM as a shift control unit.

Hereinafter, the operation of the crystal oscillator according to Embodiment 3 which has an above-described configuration will be described.

As in Embodiments 1 and 2, a stable oscillation frequency is generated from the oscillator 1, frequency signals at a part A1 in which a signal is phase-inverted by the inverter 2 and a part A2 of the input terminal of the second transistor 4 are phase-inverted from each other. By alternatingly operating the first transistor 3 and the second transistor 4, a stable oscillation signal having a constant amplitude is output to the oscillation output terminal (part A3) 5.

Since specifications including a load of an output part and harmonic characteristics are different depending on a set such as a cellular phone in which the crystal oscillator according to the embodiment is installed, in Embodiment 1, the delay time of the oscillation waveform is adjusted by arranging the first switch 11 and the second switch 12 to the other terminals of the capacitors 9 and 10, respectively and properly shifting the switches based on oscillation characteristics required by the storage device 25 for optimizing the output waveform by inserting passive elements such as resistors 7 and 8 or capacitors 9 and 10 to the parts A1, A2, and the like to delay the rise or fall of the output signal or the driving capability of an output part is configured to be able to be shifted by connecting the third transistor 20 and the third switch 21 to the second transistor 4 in parallel and turning on/off the switch.

In Embodiment 3 as described above, the same advantage as in Embodiments 1 and 2 can be acquired.

Figure 8:
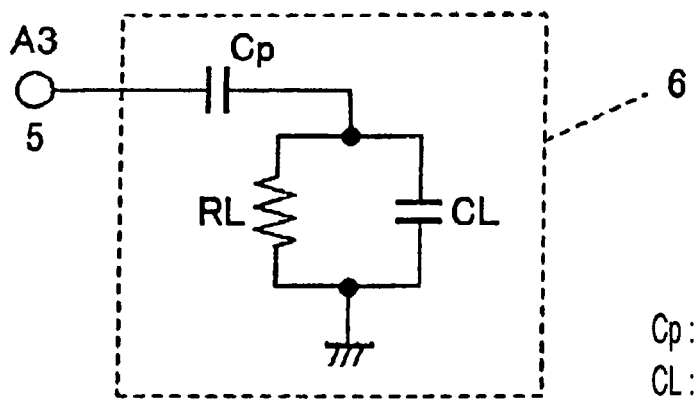
FIG. 8 is a diagram showing a configuration of an equivalent circuit of an external load element connected to an oscillation output terminal.

As an external load element 6 in Embodiments 1 to 3, a circuit represented by a bypass condenser Cp, a load capacitor CL, a load resistor RL, and the like which are shown in FIG. 8 as an equivalent circuit is used.

The present invention may be primarily applied to a crystal oscillator for temperature control, and since a crystal oscillator according to an embodiment of the present invention can adjust all the oscillation characteristics such as duty characteristics, amplitude characteristics, load variance characteristics, and harmonic characteristics to the specifications of each set in which the crystal oscillator is installed, the present invention is useful as the crystal oscillator in which the efficient responding to the specifications or frequencies of all the sets by using one IC is required.

What is claimed is:

1. A crystal oscillator formed by connecting an output terminal of an oscillator having a quartz vibrator to an oscillation output terminal through a buffer circuit, wherein a switch is connected to a part of the buffer circuit which changes oscillation characteristics, the crystal oscillator comprising a shift control unit for controlling the turning on/off of the switch, wherein an output terminal of the oscillator having the quartz vibrator is connected to an input terminal of an inverter connected to a first resistor and one terminal of a second resistor, wherein the other terminal of the first resistor is connected to one terminal of a first capacitor and an input terminal of a first transistor, wherein the other terminal of the first capacitor is connected to one terminal of a first switch, wherein the other terminal of the first switch is grounded, wherein the other terminal of the second resistor is connected to one terminal of a second capacitor and an input terminal of a second transistor, wherein the other terminal of the second capacitor is connected to one terminal of a second switch, wherein the other terminal of the second switch is grounded, wherein an output terminal of the first transistor and an output terminal of the second transistor are connected to the oscillation output terminal, and wherein the first switch and the second switch are controlled by the shift control unit.

2. A crystal oscillator formed by connecting an output terminal of an oscillator having a quartz vibrator to an oscillation output terminal through a buffer circuit, wherein a switch is connected to a part of the buffer circuit which changes oscillation characteristics, the crystal oscillator comprising a shift control unit for controlling the turning on/off of the switch, wherein an output terminal of the oscillator having the quartz vibrator is connected to an input terminal of an inverter, an output terminal of which is connected to a first resistor and one terminal of a second resistor, wherein the other terminal of the first resistor is connected to one terminal of a first capacitor and an input terminal of a first transistor, wherein the other terminal of the first capacitor is connected to one terminal of a first switch, wherein the other terminal of the switch is grounded, wherein the other terminal of the second resistor is connected to one terminal of a second capacitor, an input terminal of a second transistor, and an input terminal of a third transistor, wherein the other terminal of the second capacitor is connected to one terminal of a second switch, wherein the other terminal of the second switch is grounded, wherein an output terminal of a third transistor is connected to one terminal of the third switch, wherein the other terminal of the third switch, an output terminal of the first transistor, and an output terminal of the second transistor are connected to the oscillation output terminal, and wherein the first switch, the second switch, and the third switch are controlled by the shift control unit.

3. The crystal oscillator according to any one of claims 1 and 2, wherein the shift control unit includes a writable and readable storage device.

* * * * *